(12) United States Patent
Hager et al.

(10) Patent No.: US 8,139,361 B2
(45) Date of Patent: Mar. 20, 2012

(54) APPARATUS AND METHOD FOR ATTACHING SELECTED COMPONENTS TO A PRINTED CIRCUIT BOARD

(75) Inventors: David L. Hager, Wake Forest, NC (US); Paul A. Wormsbecher, Research Triangle Park, NC (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 12/639,092

(22) Filed: Dec. 16, 2009

(65) Prior Publication Data
US 2011/0141699 A1 Jun. 16, 2011

(51) Int. Cl.
H05K 7/20 (2006.01)
H05K 1/16 (2006.01)

(52) U.S. Cl. ........ 361/719; 361/709; 361/710; 361/702; 361/703; 361/679.54; 361/720; 361/760; 29/832; 174/260; 174/262

(58) Field of Classification Search .................. 361/702, 361/703, 709, 710, 718, 719, 679.54, 720, 361/760; 439/487; 24/548; 248/510; 29/832; 174/260, 262
See application file for complete search history.

(56) References Cited

U.S. PATENT DOCUMENTS

| | | | | |
|---|---|---|---|---|
| 5,019,940 A * | 5/1991 | Clemens | ........................ | 361/723 |
| 5,331,507 A * | 7/1994 | Kyung et al. | ................. | 361/720 |
| 5,371,652 A * | 12/1994 | Clemens et al. | ............. | 361/704 |
| 5,640,305 A | 6/1997 | Smithers | | |
| 5,734,556 A | 3/1998 | Saneinejad et al. | | |
| 5,759,004 A * | 6/1998 | Kuffel | ............................ | 411/508 |
| 5,774,335 A * | 6/1998 | Pare et al. | ...................... | 361/704 |
| 5,847,928 A * | 12/1998 | Hinshaw et al. | .............. | 361/704 |
| 5,881,800 A * | 3/1999 | Chung | .......................... | 165/80.3 |
| 5,917,701 A * | 6/1999 | Solberg | ......................... | 361/704 |
| 6,025,994 A | 2/2000 | Chiou | | |
| 6,055,159 A | 4/2000 | Sun | | |
| 6,061,240 A * | 5/2000 | Butterbaugh et al. | ........ | 361/704 |
| 6,075,699 A * | 6/2000 | Rife | ............................... | 361/704 |
| 6,201,697 B1 * | 3/2001 | McCullough | ................. | 361/704 |
| 6,208,517 B1 * | 3/2001 | Prince et al. | ................... | 361/704 |
| 6,219,244 B1 * | 4/2001 | Chen | ............................. | 361/704 |
| 6,229,703 B1 * | 5/2001 | Lee | ................................. | 361/704 |
| 6,246,584 B1 * | 6/2001 | Lee et al. | ....................... | 361/704 |
| 6,273,185 B1 * | 8/2001 | Lin et al. | ........................ | 165/185 |
| 6,282,093 B1 | 8/2001 | Goodwin | | |
| 6,301,113 B1 | 10/2001 | Guerrero | | |
| 6,313,993 B1 * | 11/2001 | Hinshaw et al. | .............. | 361/704 |
| 6,353,537 B2 | 3/2002 | Egawa | | |
| 6,424,530 B1 * | 7/2002 | Lee et al. | ....................... | 361/704 |
| 6,492,202 B1 | 12/2002 | Lober et al. | | |

(Continued)

*Primary Examiner* — Anatoly Vortman
(74) *Attorney, Agent, or Firm* — Thomas E. Tyson; Cynthia G. Seal

(57) ABSTRACT

Various embodiments of the present invention provide an anchor, circuit board assembly, and method for operably engaging an electronic component with a circuit board having a first side and a second side. Anchor embodiments include an anchor portion configured for receiving at least a portion of the electronic component and a pair of anchor legs flexibly extending from the ends of the anchor portion and configured for insertion into apertures defined in the circuit board. The anchor further includes a compression element slidably disposed about the anchor legs and movable between an unlocked position and a locked position. The compression element is configured for urging the anchor legs towards one another when moved from the unlocked position to the locked position such that the anchor is secured in the apertures when the compression element is in the locked position.

20 Claims, 8 Drawing Sheets

U.S. PATENT DOCUMENTS

| | | | |
|---|---|---|---|
| 6,496,371 B2 * | 12/2002 | Winkel et al. | 361/703 |
| 6,538,891 B1 * | 3/2003 | He et al. | 361/704 |
| 6,590,771 B2 | 7/2003 | Sopko et al. | |
| 6,646,881 B1 * | 11/2003 | Lai et al. | 361/719 |
| 6,714,416 B1 | 3/2004 | McLeod et al. | |
| 6,734,371 B2 | 5/2004 | Arrigotti et al. | |
| 6,757,171 B2 | 6/2004 | Bauer et al. | |
| 6,947,283 B2 * | 9/2005 | Hsieh et al. | 361/703 |
| 7,102,890 B2 | 9/2006 | Lee et al. | |
| 7,133,288 B2 * | 11/2006 | DelPrete et al. | 361/719 |
| 7,183,496 B2 * | 2/2007 | Arrigotti et al. | 174/260 |
| 7,218,525 B2 * | 5/2007 | Lo et al. | 361/719 |
| 7,292,444 B1 * | 11/2007 | Yang et al. | 361/709 |
| 7,321,493 B2 | 1/2008 | Liang et al. | |
| 7,382,622 B2 | 6/2008 | Li et al. | |
| 7,385,823 B1 * | 6/2008 | Desrosiers et al. | 361/710 |
| 7,417,860 B2 * | 8/2008 | Yang et al. | 361/710 |
| 7,495,919 B2 * | 2/2009 | Li | 361/710 |
| 7,518,875 B2 * | 4/2009 | Desrosiers et al. | 361/719 |
| 7,656,668 B2 * | 2/2010 | Lin | 361/710 |
| 7,697,297 B2 * | 4/2010 | Chen et al. | 361/719 |
| 7,869,217 B2 * | 1/2011 | Chen et al. | 361/710 |
| 7,885,077 B2 * | 2/2011 | Sass et al. | 361/710 |
| 2002/0039285 A1 * | 4/2002 | Hsieh et al. | 361/799 |
| 2003/0103332 A1 * | 6/2003 | Sopko et al. | 361/704 |
| 2006/0158857 A1 * | 7/2006 | Luckner et al. | 361/719 |
| 2007/0263363 A1 | 11/2007 | Liu et al. | |
| 2010/0172102 A1 * | 7/2010 | Sass et al. | 361/709 |
| 2010/0259902 A1 * | 10/2010 | Xia et al. | 361/720 |
| 2011/0044008 A1 * | 2/2011 | Barina et al. | 361/720 |

* cited by examiner

APPARATUS AND METHOD FOR ATTACHING SELECTED COMPONENTS TO A PRINTED CIRCUIT BOARD

BACKGROUND OF THE INVENTION

1. Field of the Invention

The various embodiments of the present invention described herein relate to the field of circuit board assemblies, such as, for example, printed circuit board assemblies requiring the attachment and anchoring of certain electrical components such as heat sinks.

2. Description of Related Art

In the field of printed circuit board (PCB) assemblies, there are a variety of methods and devices for attaching various electronic, structural, and cooling components to PCBs. For example, some methods for populating PCB assemblies include: surface mount technologies (SMT), compliant pin, pin-in-hole, through-hole solder and other variations on soldered and solder-free attachment techniques.

Through-hole solder techniques have often been used to attach heavier components, such as heat sink anchor components, to PCB assemblies. However, the advent of thicker PCBs, heavier copper planes and lead-free solder have made through-hole solder components more difficult to process. Furthermore, SMT and compliant pin interfaces fail to provide sufficient retention for heat sink anchors.

In order to solve these deficiencies, a number of solderless mechanical anchors have been proposed for the attachment of various components to PCB assemblies. However, many of these anchor components require relatively large mounting holes to be drilled or formed in the PCB. Other existing anchor components also lack adequate locking mechanisms for ensuring that the anchor component is positively and at least semi-permanently attached to the PCB. Furthermore, many existing anchor components require the application of an insertion force that may cause damage to the PCB at the insertion point.

Therefore, there exists a need for a near-zero insertion force, solderless anchor device for reliably and positively attaching electronic components (such as heat sink structures) to PCBs.

BRIEF SUMMARY OF THE INVENTION

The needs outlined above are met by embodiments of the present invention which, in various embodiments, provides an anchor, circuit board assembly and method that overcomes many of the technical problems discussed above, as well other technical problems, with regard to the positive attachment of electronic components to PCBs. For example, one embodiment may comprise an anchor for operably engaging an electronic component with a circuit board having a first side and a second side. The circuit board may define a first aperture and a second aperture adapted for receiving the anchor. The anchor comprises an anchor portion configured for receiving at least a portion of the electronic component, a first anchor leg flexibly extending from a first end of the anchor portion and configured for insertion into the first aperture, and a second anchor leg flexibly extending from a second end of the anchor portion and configured for insertion in the second aperture. Furthermore, the anchor legs may also comprise, in some embodiments, first and second lower retaining tabs extending respectively from the first and second anchor legs. The anchor also comprises a compression element slidably disposed about the first anchor leg and the second anchor leg and movable between an unlocked position and a locked position. The compression element may thus be configured for urging the first lower retaining tab and the second lower retaining tab towards one another when moved from the unlocked position to the locked position such that the anchor is secured in the first aperture and the second aperture of the circuit board by the cooperation of the first lower retaining tab, the second lower retaining tab, and the second side of the circuit board when the compression element is in the locked position.

In some anchor apparatus embodiments, the first and second anchor legs may further define first and second locking notches, respectively, such that the compression element may be seated in the first and second locking notches when the compression element is in the locked position. This feature allows for the anchor to be releasably secured adjacent to the first side of the circuit board. In some embodiments, the compression element may comprise a frame defining a rectangular aperture for receiving the anchor portion such that the compression element is slidably disposed about the first anchor leg and the second anchor leg extending from the anchor portion. In some such embodiments, the compression element may further comprise a retention element, extending at least partially across the rectangular aperture, and configured for engaging the compression element with the anchor when the compression element is in the unlocked position. Additionally, in some anchor embodiments, the anchor portion may comprise at least one retention tab configured for securing the compression element in slidable relation to the anchor. In such embodiments, the retention tab may be configured for engaging the compression element with the anchor when the compression element is in the unlocked position.

The various anchor apparatus embodiments provided herein may also comprise upper stop tabs extending from the first anchor leg. For example, the anchor may comprise a first upper stop tab extending from the first anchor leg and a second upper stop tab extending from the second anchor leg. In such embodiments, the first upper stop tab, the second upper stop tab, and the first side of the circuit board may cooperate to substantially secure the anchor in the first aperture and the second aperture of the circuit board when the compression element is in the locked position.

The anchor apparatus embodiments described herein may also be used to provide various circuit board assembly embodiments comprising one or more electronic components (including, but not limited to a heat sink assembly) operably engaged with a circuit board having a first side and a second side via the anchor apparatus. In such embodiments, the circuit board may define a first and second aperture configured for receiving the first and second anchor legs of the anchor apparatus. In some such embodiments, the circuit board may also comprise plating material disposed on a wall of the first aperture and the second aperture.

Furthermore, various method embodiments are described herein for providing one or more solderless attachment points for an electronic component on a circuit board having a first side and a second side. Such method embodiments may comprise steps for defining a first aperture and a second aperture in the circuit board extending from the first side to the second side of the circuit board, providing an anchor apparatus according to the various apparatus embodiments described herein, inserting the first and second anchor legs of the anchor apparatus into the corresponding first and second apertures from the first side of the circuit board such that the first lower retaining tab and the second lower retaining tab extend beyond the respective first and second apertures on the second side of the circuit board, and sliding the compression element of the anchor apparatus from the unlocked position to the locked position to secure the anchor device to the circuit board. Such method embodiments may also further comprise the further step of operably engaging at least a portion of the electronic component with the anchor. Furthermore, as described herein with respect to the circuit board assembly embodiments, the method may also comprise depositing a coating material on a wall of at least one of the first aperture and the second aperture defined in the circuit board. Such a depositing step may, in some embodiments, comprise electroplating processes.

Thus the anchor apparatus, circuit board assembly and method embodiments for operably engaging an electronic component with a PCB, as described in the embodiments of the present invention, provide many advantages that may include, but are not limited to: providing a near-zero insertion force, solderless anchor device; providing an anchor device, PCB assembly and method for reliably and positively attaching electronic components (such as heat sink structures) to PCBs without the need for solder; and providing a low-cost anchor component that provides a positive locking solution for attaching heavier electronic components to a PCB assembly.

BRIEF DESCRIPTION OF THE SEVERAL VIEWS OF THE DRAWINGS

Figure 1:
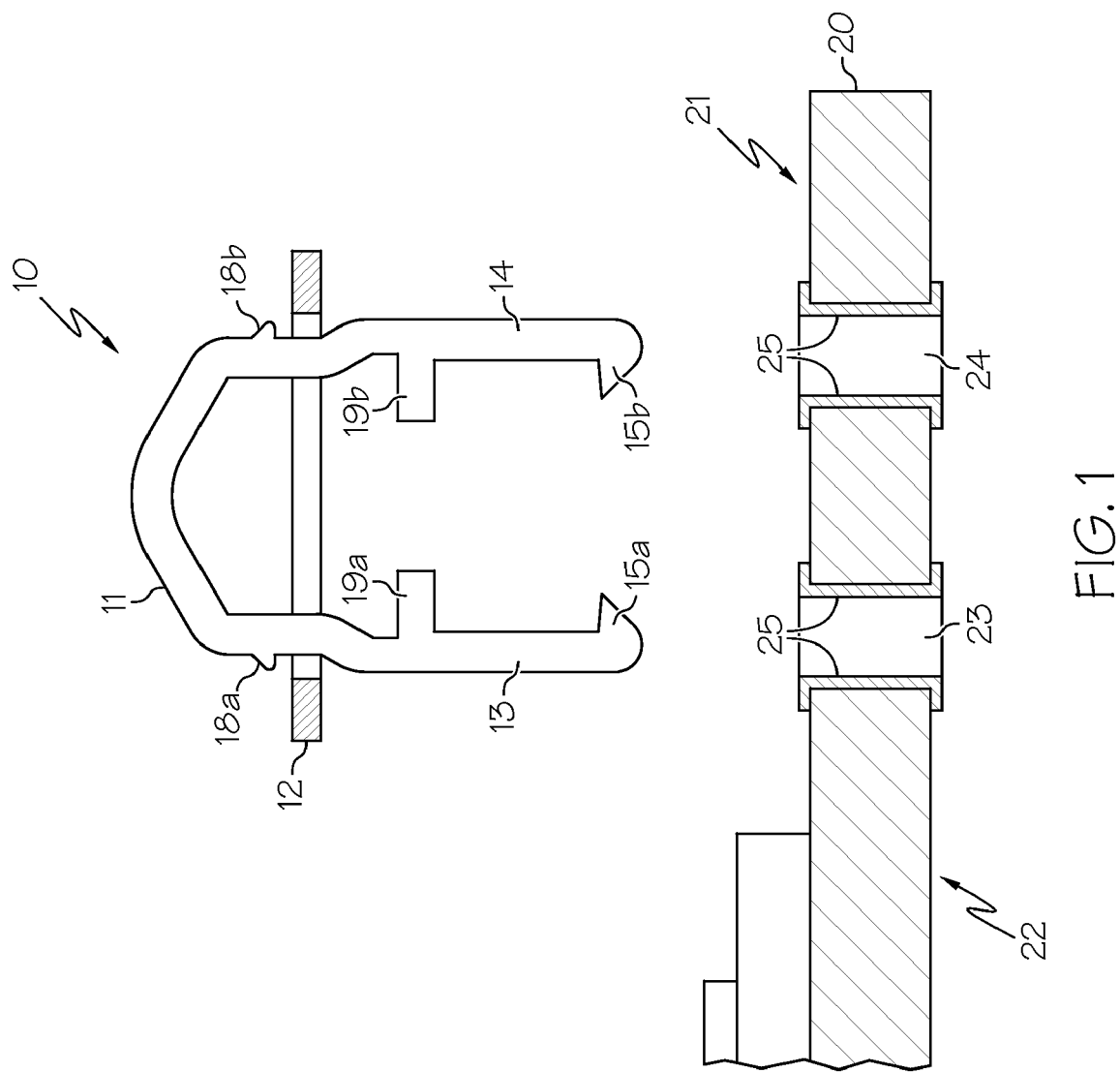
Figure 2:
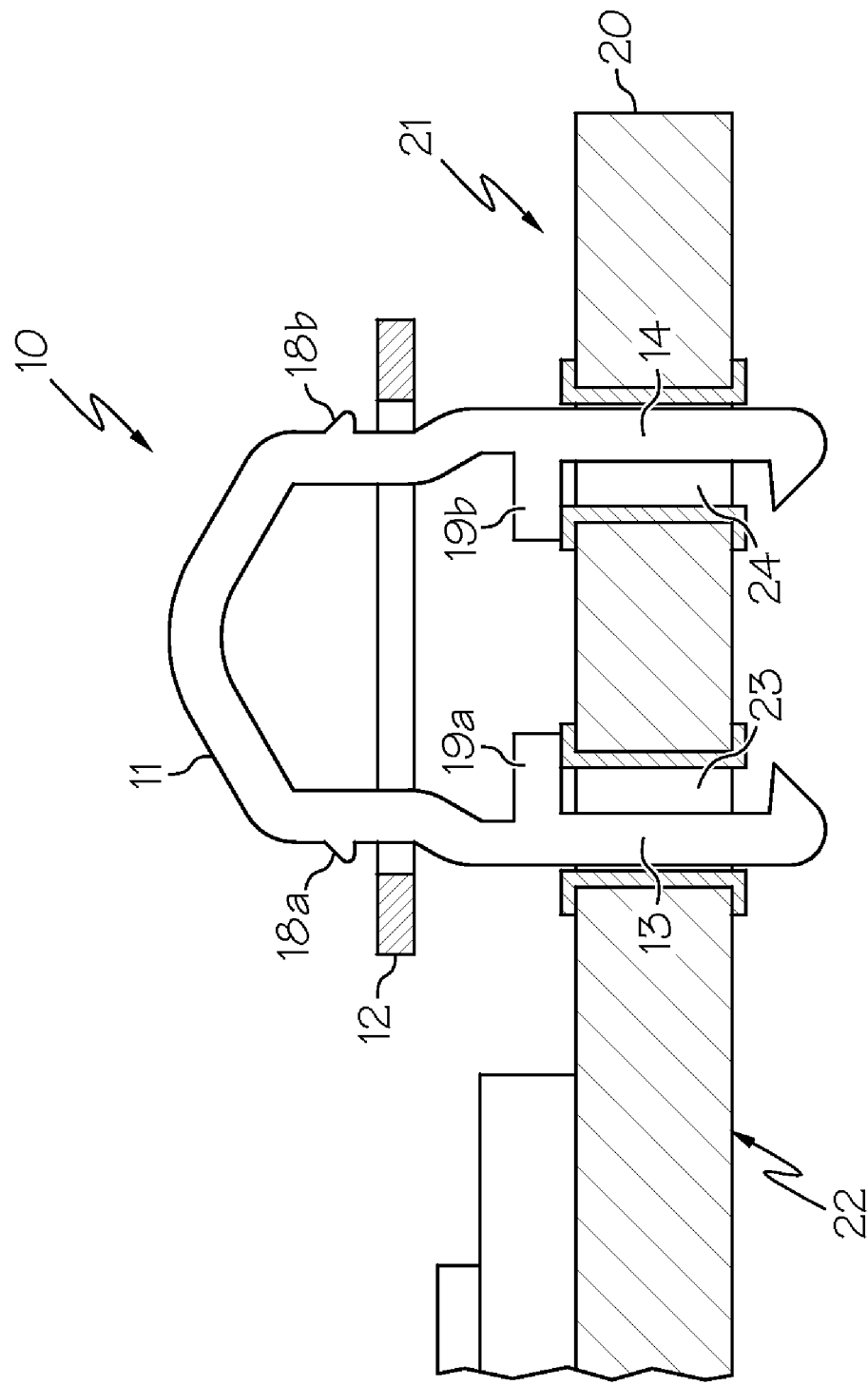
Figure 3:
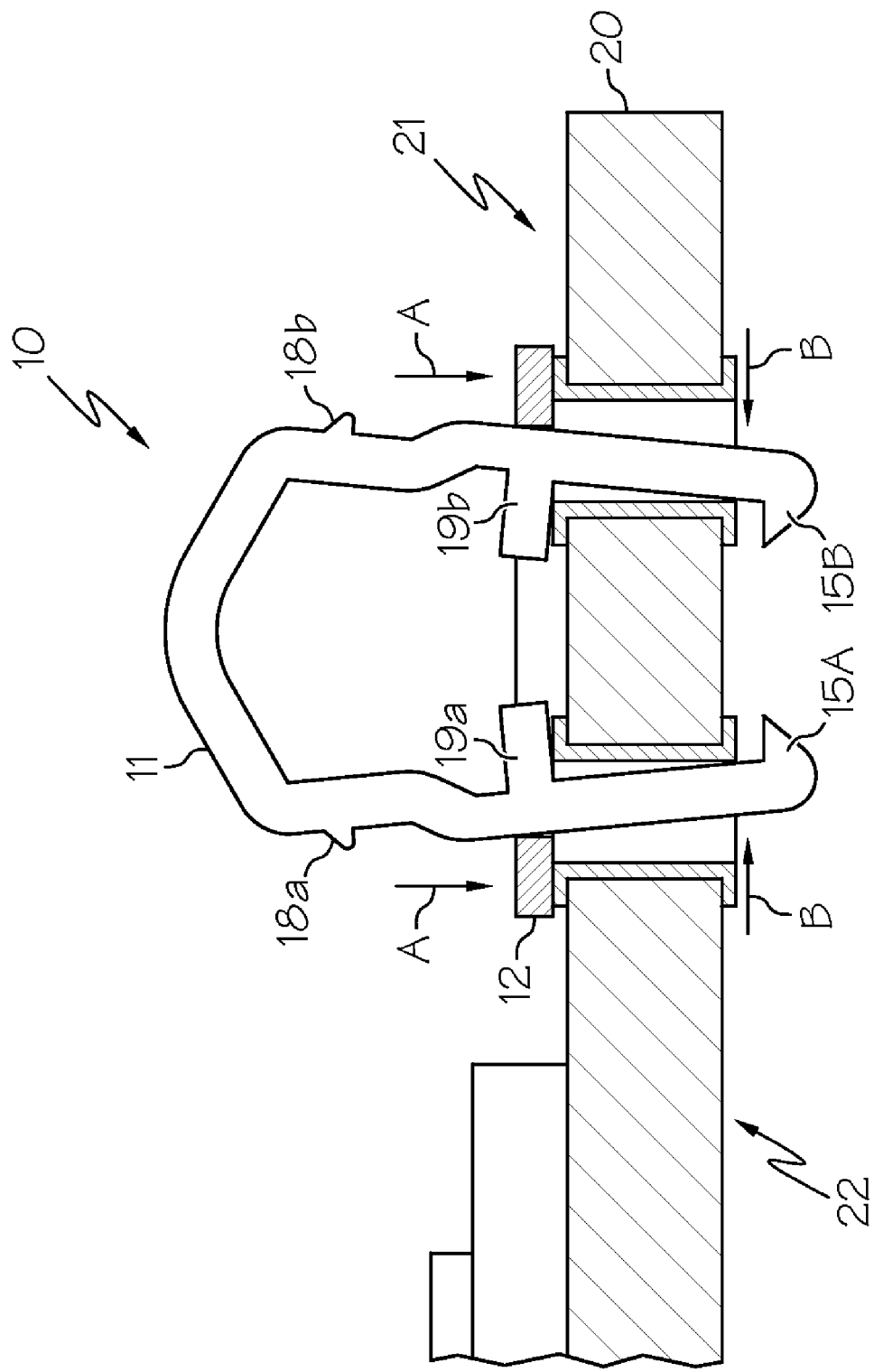
Figure 4:
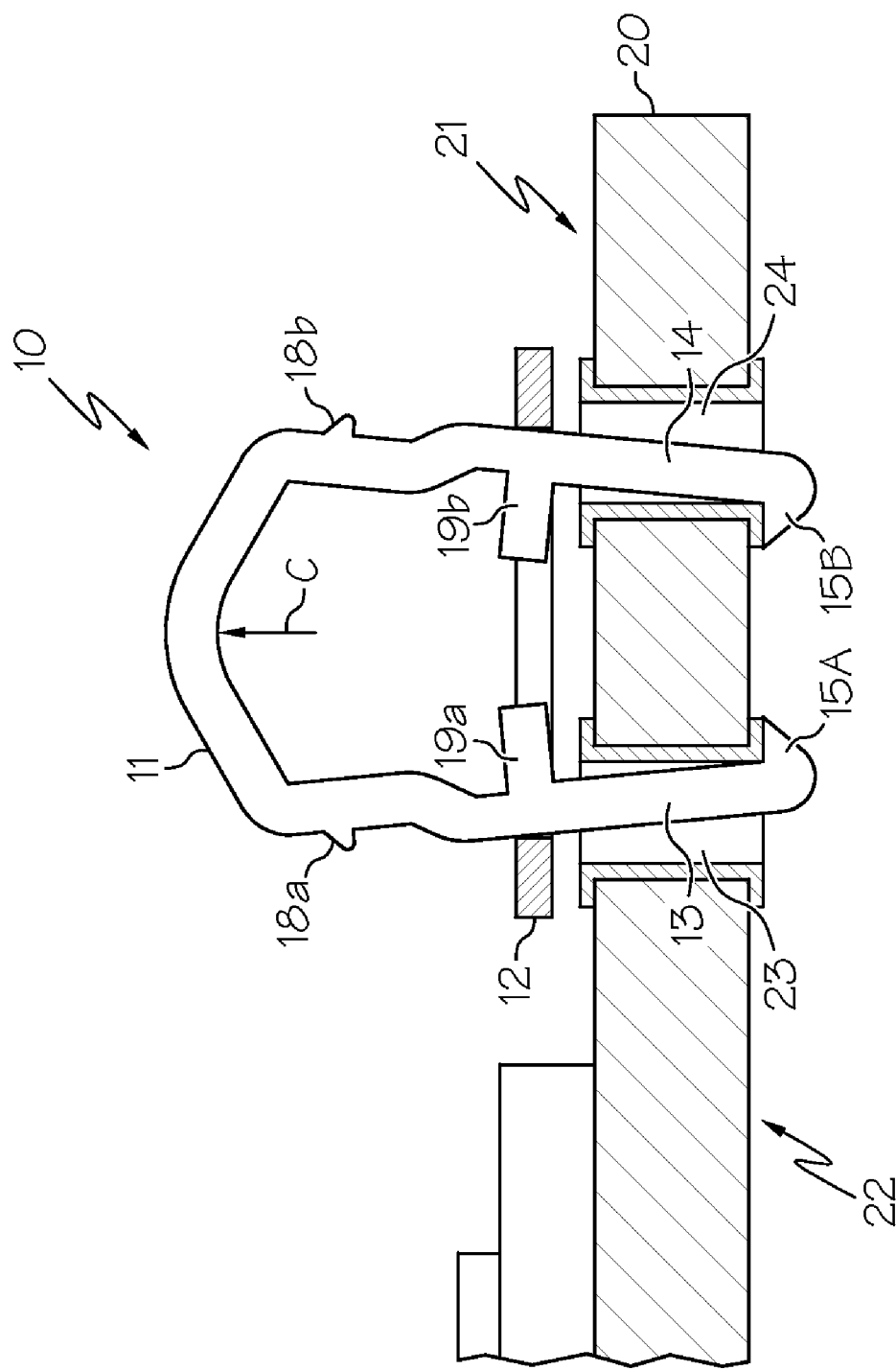
Figure 5:
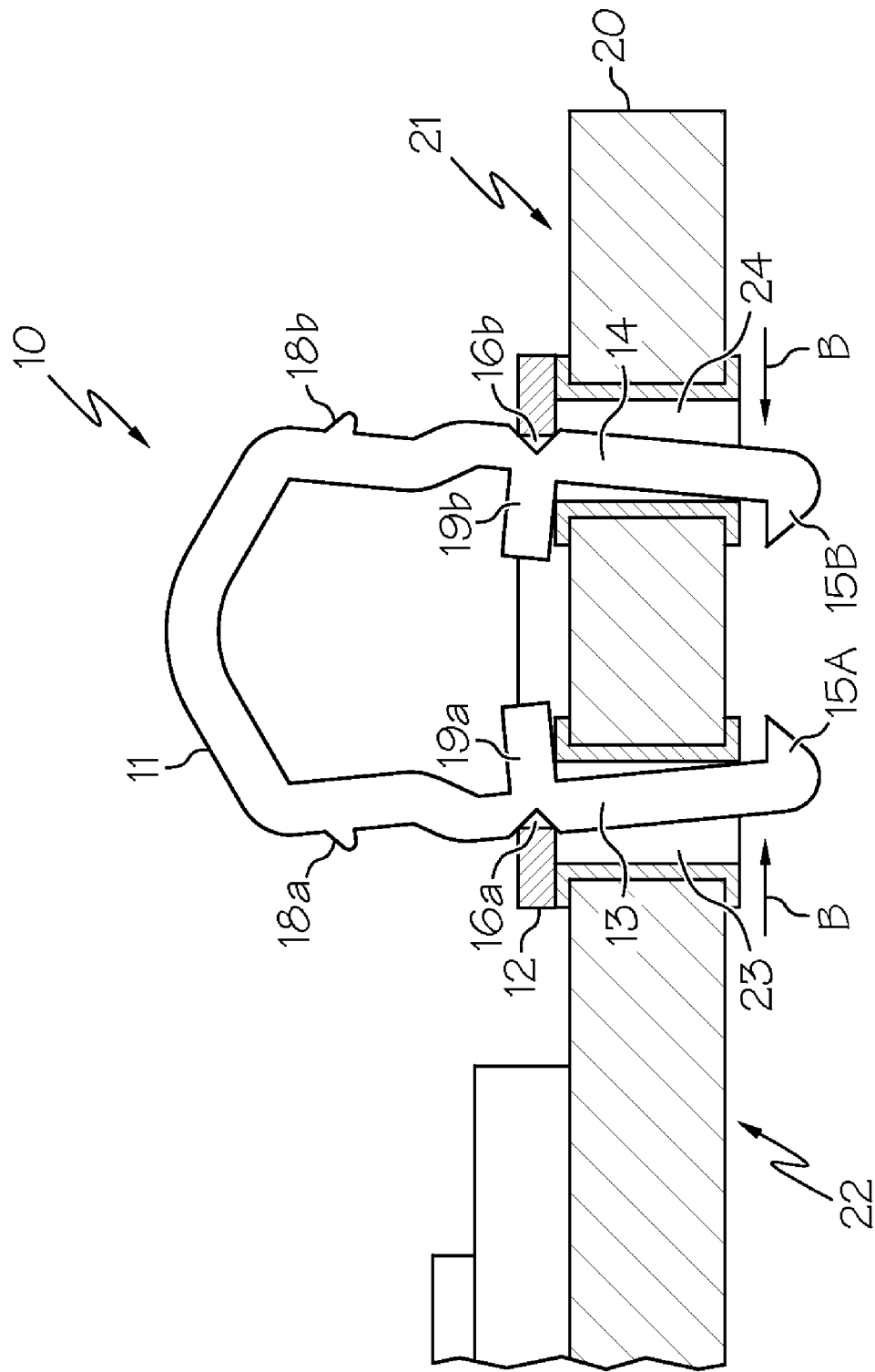
Figure 6:
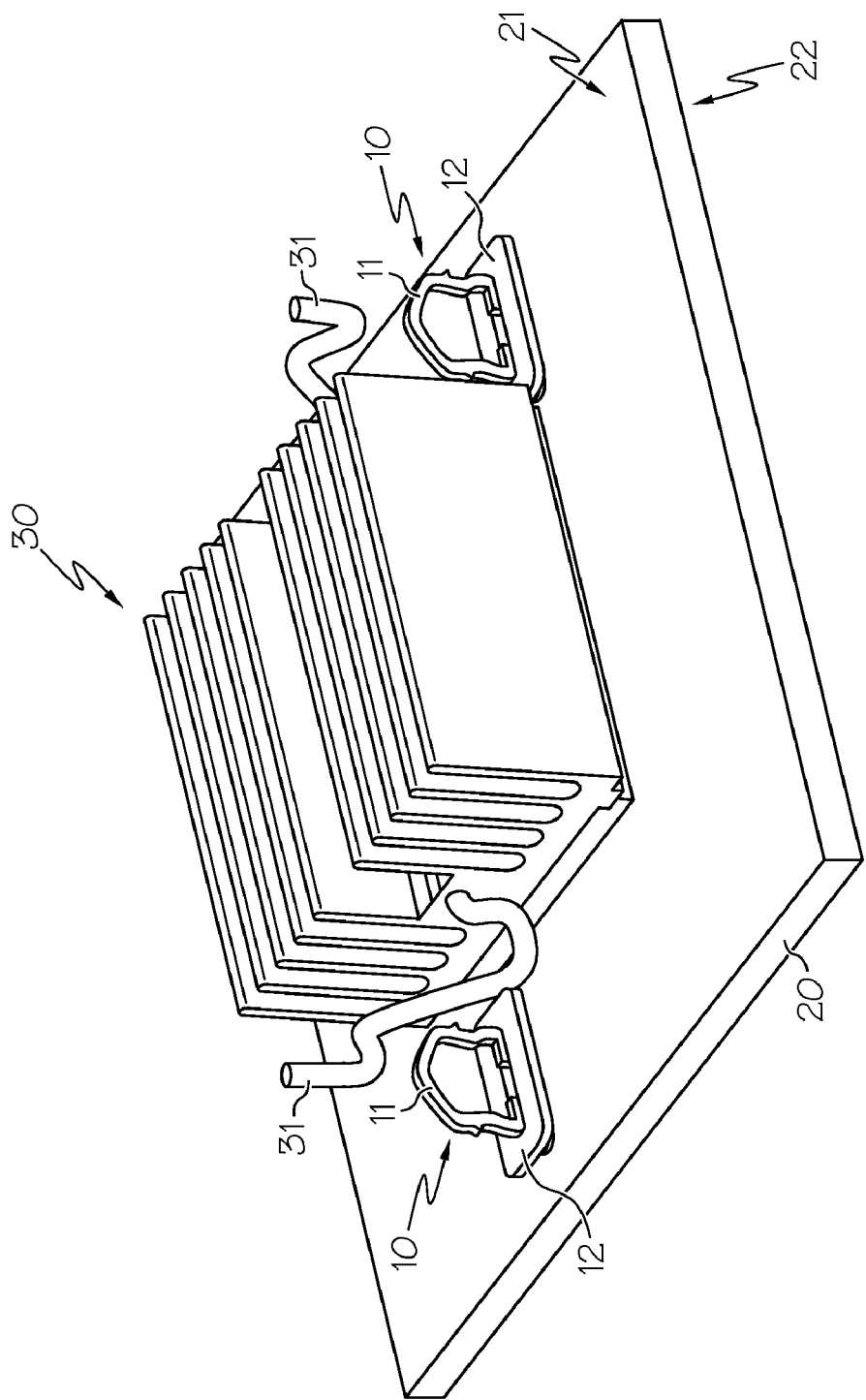
Figure 7:
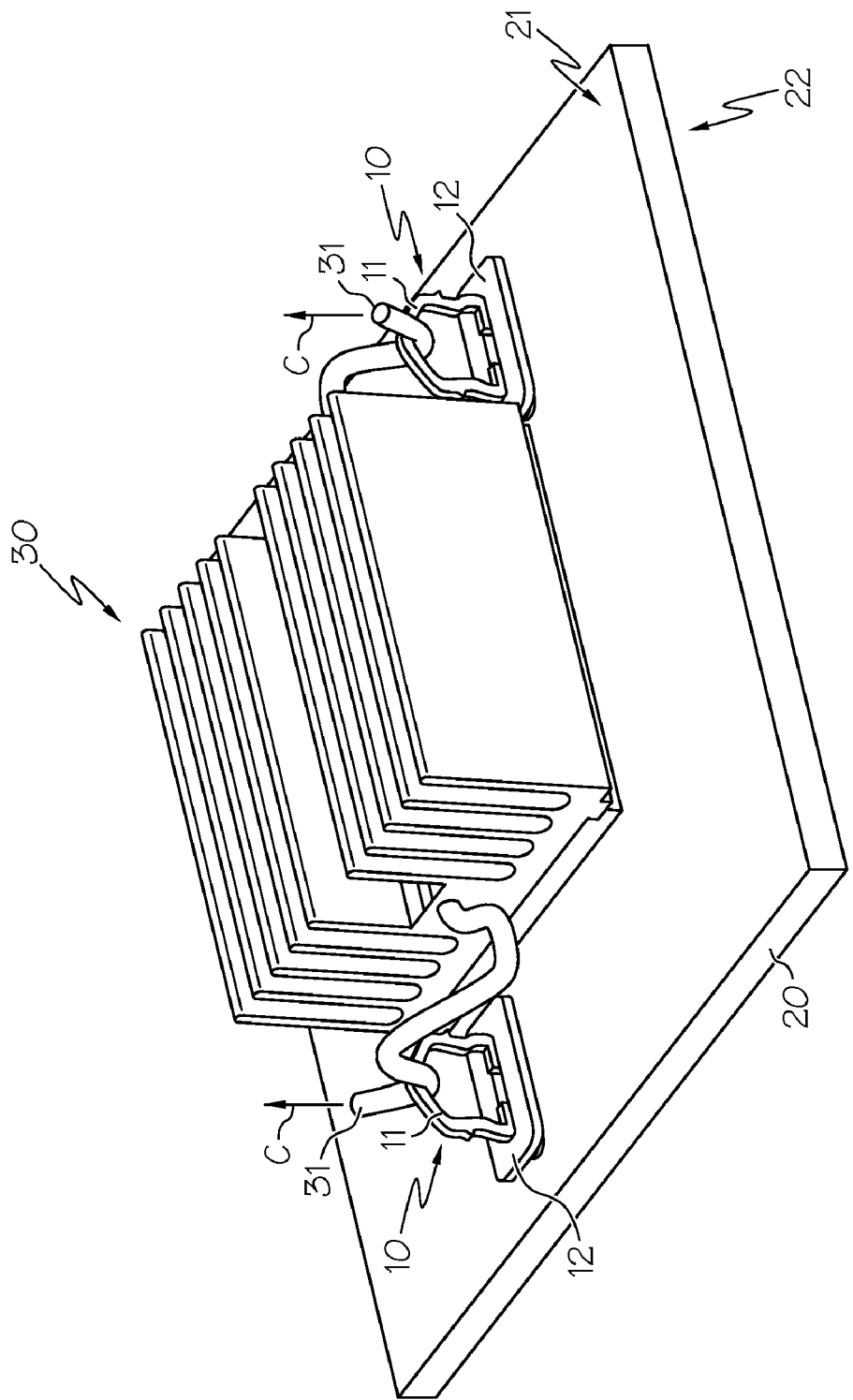
Figure 8:
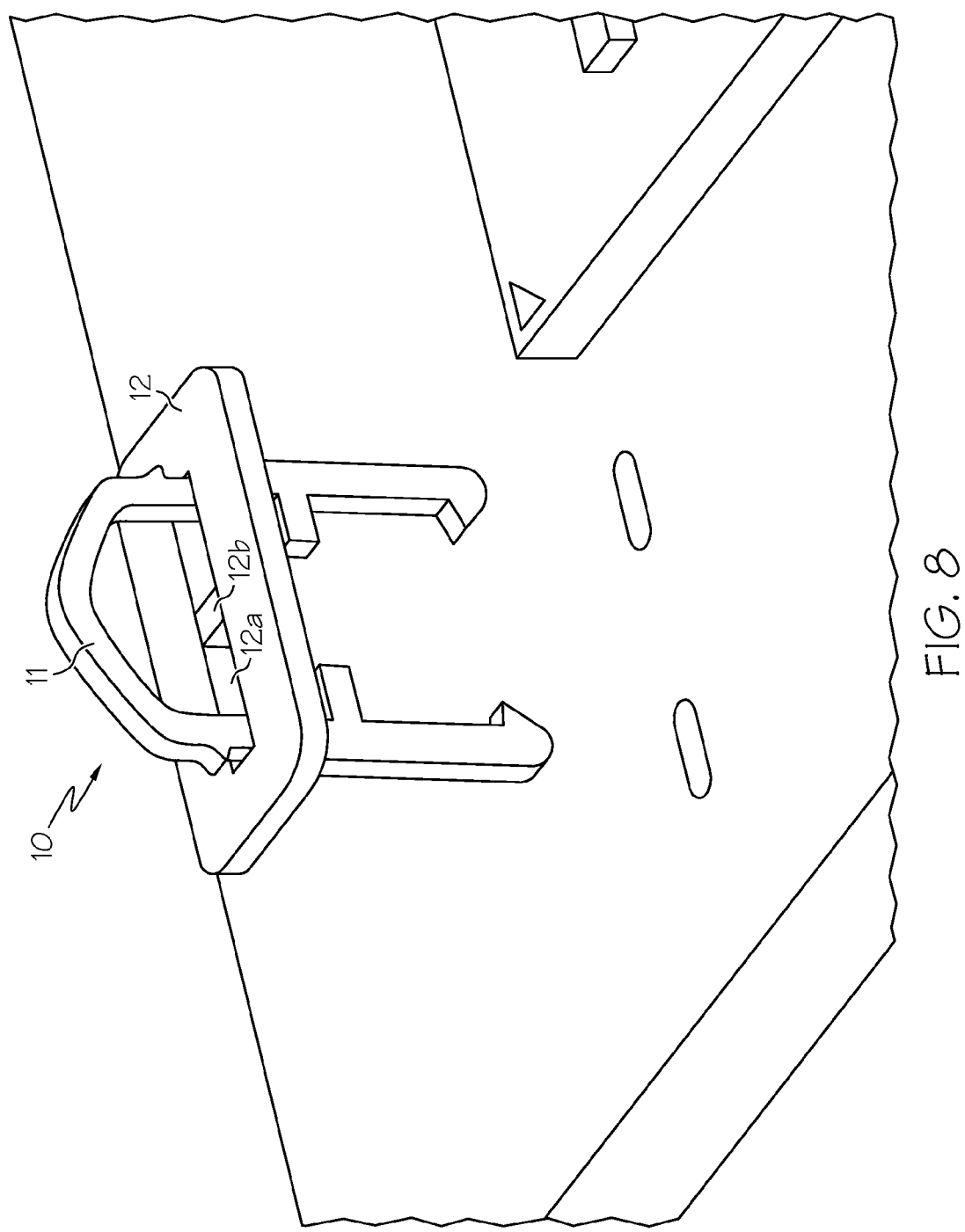

Having thus described the invention in general terms, reference will now be made to the accompanying drawings, which are not necessarily drawn to scale, and wherein:

FIG. 1 illustrates an exemplary anchor for operably engaging an electronic component with a circuit board, according to one embodiment of the present invention;

FIG. 2 illustrates an exemplary anchor device inserted into apertures defined by a circuit board, according to one embodiment of the present invention;

FIG. 3 illustrates an exemplary anchor device inserted into apertures defined by a circuit board, including a compression element seated in a locked position relative to the anchor device, according to one embodiment of the present invention;

FIG. 4 illustrates an exemplary anchor device seated in a locked position relative to a circuit board and pulled upward from the circuit board, according to one embodiment of the present invention;

FIG. 5 illustrates an exemplary anchor device operably engaged with a circuit board, including a compression element seated in locking notches defined in the anchor device, according to one embodiment of the present invention;

FIG. 6 illustrates an exemplary circuit board assembly comprising an anchor operably engaged with a circuit board and positioned to operably engage a heat sink device with the circuit board, according to one embodiment of the present invention;

FIG. 7 illustrates an exemplary circuit board assembly comprising an anchor operably engaged with a circuit board and positioned to receive at least one lock bar of a heat sink device so as to be capable of operably engaging the heat sink device with the circuit board, according to one embodiment of the present invention; and FIG. 8 illustrates an isometric view of an exemplary anchor device and compression element comprising a frame defining a rectangular aperture for receiving the anchor portion and a retention element extending across the rectangular aperture for operably engaging the compression element with the anchor, according to one embodiment of the present invention.

DETAILED DESCRIPTION OF THE INVENTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The various aspects of the present invention mentioned above, as well as many other aspects of the invention are described in greater detail below. The various anchor, circuit board assembly and method embodiments of the present invention are described herein with respect to the engagement of a heat sink component with a printed circuit board. However, it must be understood that this is only one example of the use of the present invention. Specifically, the anchor, circuit board assembly and method embodiments of the present invention can be adapted to engage and/or support various types and/or connectors of electrical components with a printed circuit board assembly. Such electrical components may include, but are not limited to: PCB housings, chassis, capacitors, connectors, power components, pin-in-hole components, processors, storage and memory components, solid state drives (SSD), conventional hard drive components, speakers, lighting components, and combinations of such electronic components.

FIG. 1 illustrates an anchor 10, for operably engaging an electronic component (such as a heat sink device 30, as shown in FIGS. 6 and 7, for example) with a circuit board 20 having a first side 21 and a second side 22. As shown in cross-section in FIG. 1, the circuit board 20 may define a first aperture 23 and a second aperture 24. While the apertures 23, 24 and corresponding anchor legs 13, 14 are shown herein with a generally rectangular cross-section, it should be understood that the apertures 23, 24 and the corresponding anchor legs 13, 14 of the anchor 10 may be formed in a variety of cross-sectional shapes that may be suitable and/or advantageous for a particular electronic device and/or circuit board assembly, including, but not limited to: rectangular, square, ovoid, circular, polygonal, or half-circular. Furthermore, and as shown generally in FIG. 1, in some embodiments, the circuit board 20 may also comprise plating material 25 (such as copper, copper alloys and/or other plating materials, metals, and alloys which may or may not comprise dielectrics, polymers, or other components) disposed on an interior wall of the first aperture 13 and the second aperture 14.

In one exemplary embodiment, the anchor 10 comprises an anchor portion 11 configured for receiving at least a portion of the electronic component (see FIG. 7, for example, showing the anchor portion 11, operably engaged with a lock bar 31 of a heat sink device 30). While the anchor portion 11 is shown in FIG. 1 as a transverse curved element, the anchor portion 11 may also assume a variety of other configurations including, but not limited to: a substantially straight and/or rectangular transverse portion, a grommet, a circular element, a semicircular element, an ovoid element, a polygonal element, a hook element, a "carabiner" element, a male or female threaded element, and/or any other standard connector element suitable for operably engaging a corresponding variety of electronic components.

Furthermore, in the exemplary embodiment of FIG. 1, the anchor 10 further comprises: a first anchor leg 13 flexibly extending from a first end of the anchor portion 11 and configured for insertion into the first aperture 23, a first lower retaining tab 15a extending from the first anchor leg 13; a second anchor leg 14 flexibly extending from a second end of the anchor portion 11 and configured for insertion in the second aperture 24; and a second lower retaining tab 15b extending from the second anchor leg 14. As shown generally in FIG. 1, the anchor portion 11, anchor legs 13, 14, and other anchor 10 components may be integrally formed and/or machined from a single piece of material including, but not limited to: spring steel, polymer, metal alloys, one or more dielectric components, one or more conductive materials, and/or combinations of such materials. In other embodiments, however, the various components (11, 13, 14, 15a, 15b, 18a, 18b, 19a, and 19b, for example) of the anchor 10 may be separately formed and subsequently operably engaged with one another (using adhesives, connectors and/or other methods that will be appreciated by one of skill in the art) in a manner consistent with the structures described and claimed herein.

FIG. 1 also shows a cross-section of a compression element 12 slidably disposed about the first anchor leg 13 and the second anchor leg 14 and movable between an unlocked position (see FIG. 2, for example) and a locked position (see FIG. 3, for example). As shown in FIG. 3, the compression element 12 may be pushed towards the first side 21 of the circuit board (depicted schematically in FIG. 3 as direction A) so as to be configured for urging the first lower retaining tab 15a and the second lower retaining tab 15b towards one another (depicted schematically in FIG. 3 as lateral direction B) when moved from the unlocked position to the locked position. In the locked position (FIG. 3, for example), the anchor 10 is secured in the first aperture 23 and the second aperture 24 of the circuit board 20 by the cooperation of the first lower retaining tab 15a, the second lower retaining tab 15b, and the second side of the circuit board 22 when the compression element 12 is in the locked position (as shown generally in FIGS. 3 and 4). Note that FIG. 4 illustrates an exemplary embodiment wherein a pull force C may be applied to pull the anchor portion 11 of the anchor 10 away from the first side 21 of the circuit board 20 such that the first lower retaining tab 15a and the second lower retaining tab 15b are urged into close contact with the second side 22 of the circuit board 20 such that the anchor 10 is secured in the first aperture 23 and the second aperture 24 of the circuit board 20 by the cooperation of the first lower retaining tab 15a, the second lower retaining tab 15b, and the second side of the circuit board 22 when the compression element 12 is in the locked position. As shown generally in the exemplary circuit board assembly of FIG. 7, the pull force C may be applied by the spring bias or other force exerted by a spring element and/or lock bar 31 of a heat sink device 30 such that the first lower retaining tab 15a, the second lower retaining tab 15b are consistently urged into contact with the second side of the circuit board 22 so as to secure the anchor 10 in the first aperture 23 and the second aperture 24 of the circuit board 20.

In some embodiments, as shown generally in the isometric view of FIG. 8, the compression element 12 may comprise a frame defining a rectangular aperture 12a for receiving the anchor portion 11 such that the compression element 12 is slidably disposed about the first anchor leg 13 and the second anchor leg 14 extending from the anchor portion 11. Furthermore, in some such embodiments (also as shown in FIG. 8), the compression element 12 may further comprises a retention element 12b extending at least partially across the rectangular aperture 12a. The retention element 12b may comprise a continuous "bridge" extending completely across the rectangular aperture 12a or as a tab extending partially across the rectangular aperture 12a. In either case, the retention element 12b is configured for operably engaging the compression element 12 with the anchor 10 when the compression element 12 is in the unlocked position (see, for example, FIG. 2) such that the compression element 12 remains associated with the anchor 10 and does not become detached from the anchor 10 within an electronic assembly (such as a PC or server device enclosure). Furthermore, as shown in FIG. 2, the anchor portion 11 and/or the anchor legs 13, 14 may comprise at least one retention tab 18a, 18b configured for securing the compression element 12 in slidable relation to the anchor 10. As described herein with respect to the optional retention tab 12a, the anchor-based retention tabs 18a, 18b may also be configured for operably engaging the compression element 12 with the anchor 10 when the compression element 12 is in the unlocked position (see FIG. 2, for example).

FIG. 5 illustrates an alternative exemplary embodiment of an anchor device 10 in a locked position, wherein the first anchor leg 13 defines a first locking notch 16a and wherein the second anchor leg 14 defines a second locking notch 16b. As shown in FIG. 5, the compression element 12 may be further configured to be capable of being seated in the first locking notch 16a and the second locking notch 16b when in the locked position so as to be releasably secured adjacent to the first side 21 of the circuit board 20. While the locking notches 16a, 16b are depicted in FIG. 5 as "V" notches, it should be understood that such locking notches may be defined as any number of shapes suitable for seating and/or retaining the compression element 12 in a "locked" position wherein the first and second anchor legs 13, 14 are urged towards one another in a lateral clamping direction B as shown in FIGS. 3 and 5.

Referring again to FIG. 1, some embodiments of the anchor 10 provided herein may also comprise a first upper stop tab 19a extending from the first anchor leg 13 and a second upper stop tab 19b extending from the second anchor leg 14. As shown generally in FIG. 2, the upper stop tabs 19a, 19b may act to prevent an assembler from pushing the anchor 10 so deep into the apertures 23, 24 defined in the circuit board 20 so as to prevent the anchor portion 11 from being accessible to at least a portion of an electronic component 30 so that the electronic component 30 (such as a heat sink device 30, as shown in FIG. 7) may not be properly operably engaged with the circuit board 20. Furthermore, and as shown generally in FIG. 3, the first upper stop tab 19a, the second upper stop tab 19b, and the first side 21 of the circuit board 22 may act in cooperation (with the lower retaining tabs 15a, 15b, in some embodiments) such that the anchor 10 is secured in the first aperture 23 and the second aperture 24 of the circuit board 20 when the compression element 12 is in the locked position.

FIGS. 6 and 7 illustrate an exemplary circuit board assembly, according to one embodiment, wherein the assembly comprises an anchor 10 (such as anchor 10 described herein and depicted generally in FIGS. 1-4) for operably engaging an electronic component 30 (such as a heat sink device 30 equipped with lock bars 31, for example) with a circuit board 20. As described herein with respect to the various anchor 10 embodiments of the present invention, the circuit board 20 includes a first side 21 and a second side 22 and may define first and second apertures 23, 24 configured for receiving the first and second anchor legs 13, 14 of the anchor 10.

As shown in FIG. 6, one or more anchors 10 may be inserted into apertures 23, 24 defined in a circuit board 20 and positioned such that the anchors 10 may be used to secure an electronic component (such as heat sink device 30, as shown in FIGS. 6 and 7) to the first side 21 of the circuit board 20 without the need for solder or other attachment techniques. In the exemplary circuit board assembly of FIG. 6, the anchor portions 11 of the respective anchors 10 are positioned on the circuit board 20 so as to be capable of receiving a lock bar 31 that may be integrated into and/or operably engaged with the heat sink device 30. As shown in FIG. 7, the lock bars 31 may be placed under the anchor portions 11 such that the lock bars' 31 upward spring bias may be used to apply the pull force C.

FIGS. 1-7 also illustrate an exemplary method for providing a solderless attachment point for an electronic component 30 (such as a heat sink device, for example) on a circuit board 20 having a first side 21 and a second side 22. In one embodiment, the method comprises defining a first aperture 23 and a second aperture 24 in the circuit board 20 extending from the first side 21 to the second side 22 of the circuit board 20. The apertures 23 may be defined using a variety of cutting, drilling, and/or punch techniques that will be appreciated by one of skill in the art of PCB manufacturing. Furthermore, as described herein with respect to FIG. 1, in some embodiments, the circuit board 20 may also comprise coating material 25 (such as copper and/or other metals, plastics, and dielectric materials) disposed on a wall of the first aperture 23 and the second aperture 24. Thus, some method embodiments may further comprise applying or depositing (by electroplating or other methods) the coating material to an inner wall of one or more of the apertures 23, 24 so as to provide an appropriate surface to receive and/or connect with the anchor legs 13, 14 of the anchor 10.

As shown generally in FIG. 1, the various method embodiments described herein also comprise providing an anchor device 10 (as described in detail herein with respect to the various anchor 10 and PCB assembly embodiments of the present invention.) The anchor device 10 comprises: an anchor portion 11 configured for operably engaging at least a portion of the electronic component 30 (see FIG. 7, for example) and first and second anchor legs 13, 14 flexibly extending from the anchor portion 10 and configured for insertion into the first and second apertures 23, 24 defined in the circuit board 20. Furthermore, as shown in FIG. 1, the provided anchor further comprises a first and second lower retaining tabs 15a, 15b extending from the anchor legs 13, 14 and a compression element 12 slidably disposed about the anchor legs 13, 14 and movable between an unlocked position (see FIG. 2, for example) and a locked position (see FIG. 3, for example). Furthermore, as described herein, the compression element 12 is configured for urging the lower retaining tabs 15a, 15b towards one another (see element B, FIG. 3, for example) when moved from the unlocked position to the locked position such that the anchor 10 is secured in the apertures 23, 24 of the circuit board 20 by the cooperation of the lower retaining tabs 15a, 15b, and the second side 22 of the circuit board 20 when the compression element 12 is in the locked position (as shown generally in FIG. 3).

As shown in FIG. 5, the method embodiments of the present invention may further comprise defining first and second locking notches 16a, 16b in the first and second anchor legs 13, 14, respectively, so as to enable the seating of the compression element 12 in the locking notches 16a, 16b when in the locked position (see FIG. 5) such that the compression element 12 is releasably secured adjacent to the first side 21 of the circuit board 20.

As shown in FIG. 2, the various method embodiments of the present invention also comprise inserting the anchor legs 13, 14 into the first and second apertures 23, 24, respectively, such that the lower retaining tabs 15a, 15b extend beyond the respective first and second apertures 23, 24 on the second side 22 of the circuit board 20. FIG. 3 depicts the additional method step of sliding the compression element 12 from the unlocked position (see FIG. 2, for example) to the locked position (see FIG. 3, for example) to secure the anchor device to the circuit board. Note that the movement of the compression element 12 in this step is depicted schematically in FIG. 3 as direction A.

Note that FIG. 4 illustrates an additional exemplary method embodiment comprising applying a pull force C to pull the anchor portion 11 of the anchor 10 away from the first side 21 of the circuit board 20 such that the first lower retaining tab 15a and the second lower retaining tab 15b are urged into close contact with the second side 22 of the circuit board 20 such that the anchor 10 is secured in the first aperture 23 and the second aperture 24 of the circuit board 20 by the cooperation of the first lower retaining tab 15a, the second lower retaining tab 15b, and the second side of the circuit board 22 when the compression element 12 is in the locked position. According to various method embodiments, the method may further comprise the step of operably engaging at least a portion of an electronic component 30 (including, but not limited to a heat sink device) with the deployed anchor 10 (see FIGS. 3 and 4, for example). As shown generally in the exemplary circuit board assembly of FIG. 7, the pull force C may be applied in this step by the spring bias or other force exerted by a spring element and/or lock bar 31 of a heat sink device 30 that may be operably engaged with the anchor 10 such that the first lower retaining tab 15a, the second lower retaining tab 15b are consistently urged into contact with the second side of the circuit board 22 so as to secure the anchor 10 in the first aperture 23 and the second aperture 24 of the circuit board 20.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An anchor for operably engaging an electronic component with a circuit board having a first side and a second side, the circuit board defining a first aperture and a second aperture, the anchor comprising:

an anchor portion configured for receiving at least a portion of the electronic component;

a first anchor leg flexibly extending from a first end of the anchor portion and configured for insertion into the first aperture;

a first lower retaining tab extending from the first anchor leg;

a second anchor leg flexibly extending from a second end of the anchor portion and configured for insertion in the second aperture;

a second lower retaining tab extending from the second anchor leg; and a compression element slidably disposed about the first anchor leg and the second anchor leg and movable between an unlocked position and a locked position, the compression element configured for urging the first lower retaining tab and the second lower retaining tab towards one another when moved from the unlocked position to the locked position such that the anchor is secured in the first aperture and the second aperture of the circuit board by the cooperation of the first lower retaining tab, the second lower retaining tab, and the second side of the circuit board when the compression element is in the locked position.

2. The anchor of claim 1, wherein the first anchor leg defines a first locking notch, wherein the second anchor leg defines a second locking notch, and wherein the compression element is further configured to be capable of being seated in the first locking notch and the second locking notch when in the locked position so as to be releasably secured adjacent to the first side of the circuit board.

3. The anchor of claim 1, wherein the compression element comprises a frame defining a rectangular aperture for receiving the anchor portion such that the compression element is slidably disposed about the first anchor leg and the second anchor leg extending from the anchor portion.

4. The anchor of claim 3, wherein the compression element further comprises a retention element extending at least partially across the rectangular aperture, the retention element being configured for operably engaging the compression element with the anchor when the compression element is in the unlocked position.

5. The anchor of claim 1, wherein the anchor portion comprises at least one retention tab configured for securing the compression element in slidable relation to the anchor, the retention tab being further configured for operably engaging the compression element with the anchor when the compression element is in the unlocked position.

6. The anchor of claim 1, further comprising:
a first upper stop tab extending from the first anchor leg; and
a second upper stop tab extending from the second anchor leg, wherein the first upper stop tab, the second upper stop tab, and the first side of the circuit board cooperate such that the anchor is secured in the first aperture and the second aperture of the circuit board when the compression element is in the locked position.

7. A circuit board assembly comprising:
a circuit board having a first side and a second side, the circuit board defining a first aperture and a second aperture;
an electronic component; and
an anchor for operably engaging the electronic component with the circuit board, the anchor comprising:
an anchor portion configured for operably engaging at least a portion of the electronic component;
a first anchor leg flexibly extending from a first end of the anchor portion and configured for insertion into the first aperture;
a first lower retaining tab extending from the first anchor leg;
a second anchor leg flexibly extending from a second end of the anchor portion and configured for insertion in the second aperture;
a second lower retaining tab extending from the second anchor leg; and
a compression element slidably disposed about the first anchor leg and the second anchor leg and movable between an unlocked position and a locked position, the compression element configured for urging the first lower retaining tab and the second lower retaining tab towards one another when moved from the unlocked position to the locked position such that the anchor is secured in the first aperture and the second aperture of the circuit board by the cooperation of the first lower retaining tab, the second lower retaining tab, and the second side of the circuit board when the compression element is in the locked position.

8. The circuit board assembly of claim 7, wherein the first anchor leg defines a first locking notch, wherein the second anchor leg defines a second locking notch, and wherein the compression element is further configured to be capable of being seated in the first locking notch and the second locking notch when in the locked position so as to be releasably secured adjacent to the first side of the circuit board.

9. The circuit board assembly of claim 7, wherein the compression element comprises a frame defining a rectangular aperture for receiving the anchor portion such that the compression element is slidably disposed about the first anchor leg and the second anchor leg.

10. The circuit board assembly of claim 9, wherein the compression element further comprises a retention element extending at least partially across the rectangular aperture, the retention element being configured for operably engaging the compression element with the anchor when the compression element is in the unlocked position.

11. The circuit board assembly of claim 7, wherein the anchor portion comprises at least one retention tab configured for securing the compression element in slidable relation to the anchor, the retention tab being further configured for operably engaging the compression element with the anchor when the compression element is in the unlocked position.

12. The circuit board assembly of claim 7, further comprising:
a first upper stop tab extending from the first anchor leg; and
a second upper stop tab extending from the second anchor leg, wherein the first upper stop tab, the second upper stop tab, and the first side of the circuit board cooperate such that the anchor is secured in the first aperture and the second aperture of the circuit board when the compression element is in the locked position.

13. The circuit board assembly of claim 7 wherein the circuit board comprises plating material disposed on a wall of the first aperture and the second aperture.

14. The circuit board assembly of claim 7, wherein the electronic component comprises a heat sink.

15. A method for providing a solderless attachment point for an electronic component on a circuit board having a first side and a second side, the method comprising:
defining a first aperture and a second aperture in the circuit board extending from the first side to the second side of the circuit board;
providing an anchor device, the anchor device comprising:
an anchor portion configured for operably engaging at least a portion of the electronic component;
a first anchor leg flexibly extending from a first end of the anchor portion and configured for insertion into the first aperture;
a first lower retaining tab extending from the first anchor leg;
a second anchor leg flexibly extending from a second end of the anchor portion and configured for insertion in the second aperture;
a second lower retaining tab extending from the second anchor leg; and
a compression element slidably disposed about the first anchor leg and the second anchor leg and movable between an unlocked position and a locked position, the compression element configured for urging the first lower retaining tab and the second lower retaining tab towards one another when moved from the unlocked position to the locked position such that the anchor is secured in the first aperture and the second aperture of the circuit board by the cooperation of the first lower retaining tab, the second lower retaining tab, and the second side of the circuit board when the compression element is in the locked position;

inserting the first anchor leg into the first aperture and the second anchor leg into the second aperture from the first side of the circuit board such that the first lower retaining tab and the second lower retaining tab extend beyond the respective first and second apertures on the second side of the circuit board;

sliding the compression element from the unlocked position to the locked position to secure the anchor device to the circuit board.

16. The method of claim 15, further comprising operably engaging at least a portion of the electronic component with the anchor.

17. The method of claim 16, wherein the electronic component comprises a heat sink device.

18. The method of claim 15, further comprising depositing a coating material on a wall of at least one of the first aperture and the second aperture.

19. The method of claim 18, wherein the depositing step comprises electroplating.

20. The method of claim 15, further comprising:
defining a first locking notch in the first anchor leg;
defining a second locking notch in the second anchor leg, and
seating the compression element in the first locking notch and the second locking notch when in the locked position such that the compression element is releasably secured adjacent to the first side of the circuit board.

* * * * *